United States Patent
Liu et al.

(10) Patent No.: US 12,189,283 B2
(45) Date of Patent: Jan. 7, 2025

(54) PARTICLE PREVENTION METHOD IN RETICLE POD

(71) Applicant: TAIWAN SEMICONDUCTOR MANUFACTURING COMPANY LTD., Hsinchu (TW)

(72) Inventors: Tzu Han Liu, Tainan (TW); Chih-Wei Wen, Tainan (TW); Chung-Hung Lin, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 337 days.

(21) Appl. No.: 17/818,392

(22) Filed: Aug. 9, 2022

(65) Prior Publication Data

US 2022/0382143 A1    Dec. 1, 2022

Related U.S. Application Data

(62) Division of application No. 17/004,998, filed on Aug. 27, 2020, now Pat. No. 11,703,754.

(60) Provisional application No. 63/024,864, filed on May 14, 2020.

(51) Int. Cl.
   *G03F 1/66*    (2012.01)
   *H01L 21/673*   (2006.01)

(52) U.S. Cl.
   CPC .......... *G03F 1/66* (2013.01); *H01L 21/67359* (2013.01); *H01L 21/67376* (2013.01); *H01L 21/67386* (2013.01)

(58) Field of Classification Search
   CPC .......... G03F 1/66; G03F 1/82; G03F 7/70741; H01L 21/67359; H01L 21/67376; H01L 21/67386; H01L 21/67069; H01L 21/67225; H01L 21/67389; H01L 21/67748; H01L 21/67028; H01L 21/67051; H01L 21/67393; H01L 21/67775
   See application file for complete search history.

(56) References Cited

U.S. PATENT DOCUMENTS

| 11,442,370 | B2 * | 9/2022 | Chuang | ............ H01L 21/67376 |
| 2010/0294397 | A1 * | 11/2010 | Kishkovich | ............... G03F 1/66 141/66 |
| 2012/0037522 | A1 * | 2/2012 | Chiu | ................. H01L 21/67359 206/316.1 |
| 2014/0116920 | A1 * | 5/2014 | Lee | .................... B65D 81/2015 53/485 |

(Continued)

*Primary Examiner* — Deoram Persaud
(74) *Attorney, Agent, or Firm* — WPAT LAW; Anthony King

(57) ABSTRACT

A method is provided. The method includes detaching an upper shell of a reticle pod from a base. The method further includes while the upper shell is detached from the base, blocking an inlet flow of gas from entering an interior of the reticle pod between the upper shell and the base with a use of a fluid regulating module which is in a sealed state. In the sealed state of the fluid regulating module, an opening of the fluid regulating module is covered with a sealing film. The method also includes removing a reticle positioned on the base to a process tool. In addition, the method includes performing a lithography operation in the process tool with the use of the reticle.

20 Claims, 14 Drawing Sheets

(56) References Cited

U.S. PATENT DOCUMENTS

2016/0340947 A1* 11/2016 Mazzocco .............. E05C 19/166
2021/0048114 A1* 2/2021 Chuang ................. B65D 85/38

* cited by examiner

PARTICLE PREVENTION METHOD IN RETICLE POD

PRIORITY CLAIM AND CROSS-REFERENCE

This application is a divisional and claims the benefit of U.S. non-provisional application Ser. No. 17/004,998 filed on Aug. 27, 2021, which claims priority of U.S. provisional application Ser. No. 63/024,864 filed on May 14, 2020, the disclosures of which are hereby incorporated by reference in its entirety.

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrink the process node towards the 7 nm node). When semiconductor devices are scaled down, new techniques are used to maintain the electronic components' performance from one generation to the next.

To fabricate extremely small features, photolithographic techniques such as extreme ultraviolet (EUV) lithography, X-Ray lithography, ion beam projection lithography and electron-beam projection lithography are developed. Photolithographic techniques involve forming a photoresist layer over a substrate, exposing portions of the photoresist material to a pattern of light in accordance with a desired pattern, developing the photoresist material to remove portions of the photoresist material to expose portions of the underlying material. In addition, a suitable etching process such as dry etching, wet etching and the like may then be performed on the substrate. As a result, the exposed underlying material may be removed to produce the desired pattern.

Although numerous improvements to the methods of lithography operation have been invented, they have not been entirely satisfactory in all respects. Consequently, it would be desirable to provide a solution to improve the lithography operation so as to improve the product yield of the semiconductor wafer.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
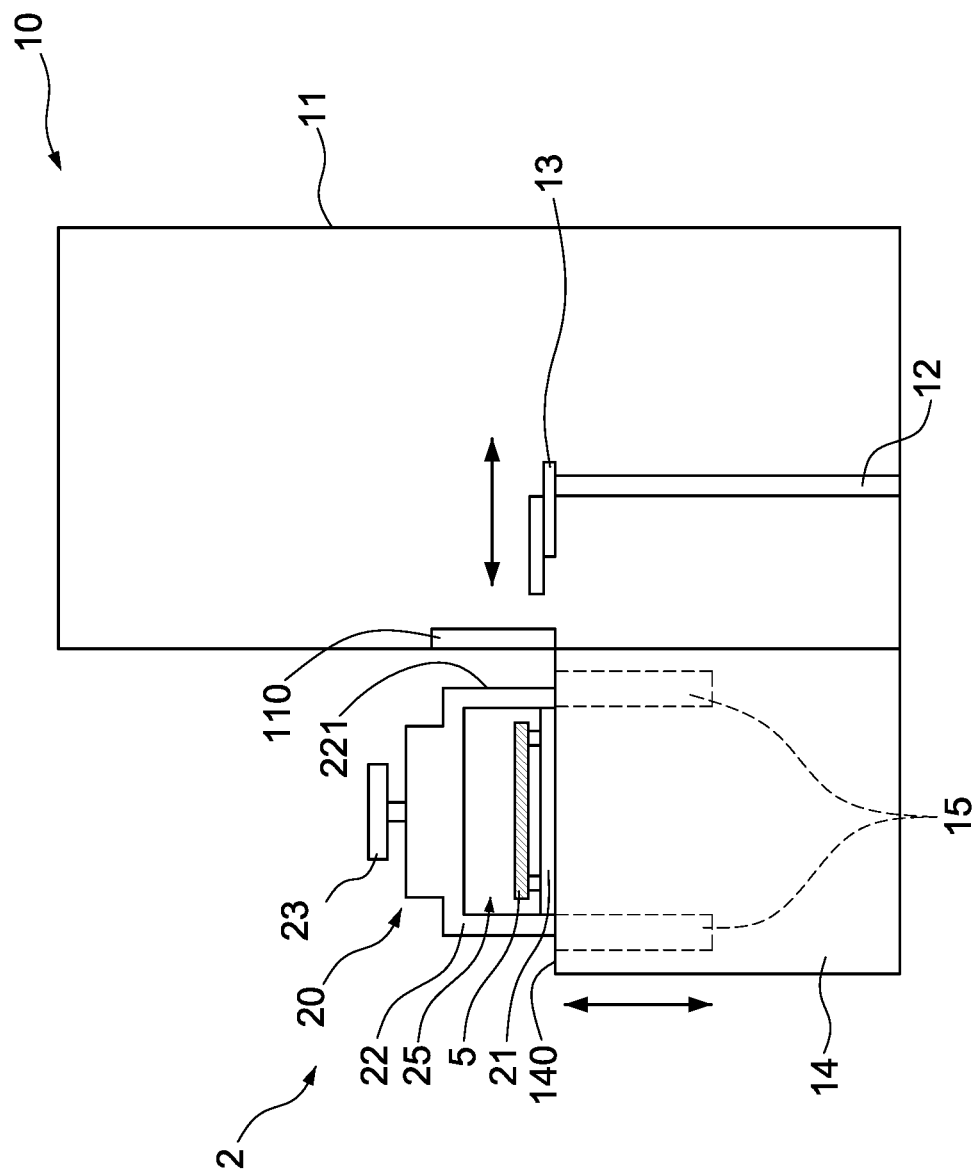
FIG. 1 is a schematic view diagram illustrating a semiconductor fabrication system, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

The advanced lithography operation, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

During a lithography operation of semiconductor production, light energy is applied through a reticle onto a photoresist material previously deposited on a wafer to define circuit patterns. A reticle is a plate patterned with a circuit image to be formed in the photoresist coating on the wafer. A reticle may contain the circuit pattern image for a few of the die on a wafer, such as four dies, for example. Reticle is remained meticulously clean for the creation of perfect images during its many exposures to pattern a circuit configuration on a substrate. The reticle may be easily damaged such as by dropping of the reticle, the formation of scratches on the reticle surface, electrostatic discharge (ESD), and particles. Because these circuit patterns on the photoresist represent a two-dimensional configuration of the circuit to be fabricated on the wafer, generation of particles on the reticle may degrade the resolution of the circuit patterns. Embodiments of the present disclosure provide a method for minimizing or eliminating particle generation on the reticle storing in a reticle pod.

FIG. 1 is a schematic view diagram illustrating a semiconductor fabrication system 10, in accordance with some embodiments of the present disclosure. In some embodiments, the semiconductor fabrication system 10 includes a processing tool 11. The processing tool 11 may be configured to perform a lithography operation on semiconductor wafers (not shown in figures) and may be any kind of lithography apparatuses such as immersion scanners, extreme ultraviolet (EUV) scanners, stepper and/or the like. Alternatively, the processing tool 11 may be any type of processing tool, such as metrology, inspection, cleaning, testing tools, or other suitable tools.

In some embodiments, the semiconductor fabrication system 10 further includes a number of load ports 14 (only one load port 14 is shown in FIG. 1). The load ports 14 are configured to support and dock reticle pods 2 for facilitating the insertion of reticles 5 into, and their subsequent removal from, the processing tool 11. The load ports 14 are positioned in such a way that they correspond to the access door 110 of the processing tool 11 for transferring reticle carriers 10 into the processing tool 11.

In some embodiments, the semiconductor fabrication system 10 further includes a number of lift pins 15. The lift pins 15 are configured to automatically open or close the reticle pod 2 when the reticle pod 2 is positioned on the load port 14. In some embodiments, as shown in FIG. 1, the lift pins 15 are positioned below a bottom of an upper shell 22 of the reticle 2. The lift pins 15 may be connected to an actuator (not shown in figures) positioned in the load port 14 and is driven to vertically move between a lower position and a higher position by the actuator so as to detach an upper shell 22 from a base 21 of the reticle pod 2. Structural features of the reticle pod 2 are described in detailed below.

Figure 2:
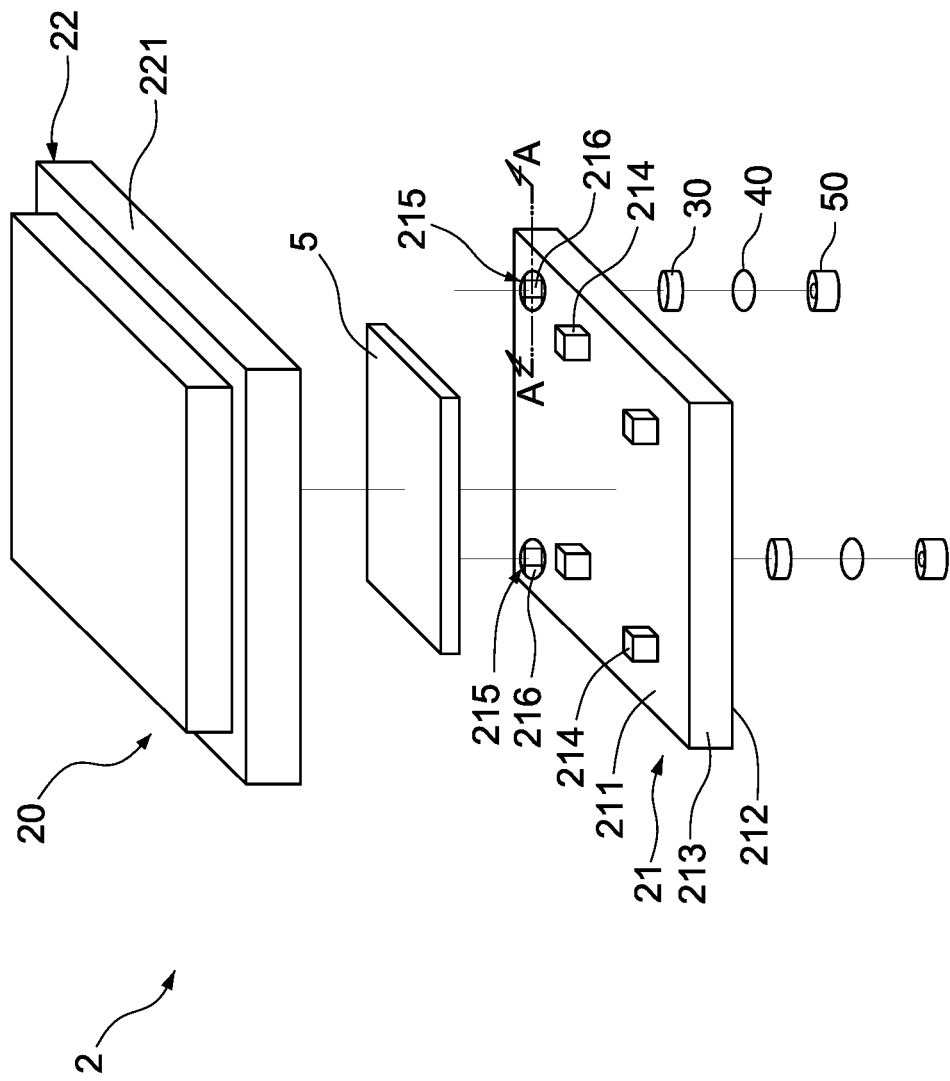
FIG. 2 is an exploded view of a reticle pod with a reticle positioned therein, in accordance with some embodiments of the present disclosure.

FIG. 2 is an exploded view of a reticle pod 2 with a reticle 5 positioned therein, in accordance with some embodiments of the present disclosure. In some embodiments, the reticle pod 2 includes a container 20, a number of fluid regulating modules, such as two fluid regulating modules 30, a number of filters, such as two filters 40, and a number of vent-hole caps, such two vent-hole caps 50. The container 20 is configured to accommodate and protect one or more reticle 5 that is used in semiconductor fabrication process. In some embodiments, one reticle 5 for lithography operation is stored in the container 20. In some other embodiments, the reticle pod 2 has a dual pod design and further includes an inner pod (not shown in figures). The reticle 5 may be stored in an inner pod (not shown in figures) in advanced, and the inner pod along with the reticle are then placed into the container 20, thereby the reticle 5 is protected from being contaminated by the inner pod and the container simultaneously during reticle transportation.

In the present embodiment, the reticle 5 is a reflective mask including suitable materials, such as molybdenum-silicon (Mo/Si) film pairs, that are configurable to highly reflect the EUV light. However, it will be appreciated that many variations and modifications can be made to embodiments of the disclosure. The reticle 5 may be a transparent mask and is used in an immersion scanner. A pellicle (e.g., a thin transparent film) may be deposited on the reticle 5 to prevent contaminant particles from landing on the reticle 5 and degrading the result of photolithography operation (e.g., by keeping contaminant particles away from a plane of focus of the reticle 5.)

In some embodiments, the container 20 includes the base 21 and the upper shell 22 mentioned above. The upper shell 22 is detachably connected to the base 21, and an interior 25 of the container 20 is formed between the base 21 and the upper shell 22 when the upper shell 22 is engaged with the base 21. In some embodiments, the upper shell 22 includes a lateral wall 221 vertically extends. When the upper shell 22 is engaged with the base 21, the lateral wall 221 is engaged with a side edge 213 of the base 21. A sealing ring (not shown in figure) may be positioned between the lateral wall 221 and the side edge 213 for maintaining the reticles in a controlled environment during transport isolated from the ambient FAB (fabrication facility) conditions to prevent contamination. In some embodiments, as shown in FIG. 1, a grip element 23 is affixed to the upper shell 22 so that an overhead hoist transport (OHT) system (not shown in figures) can easily carry the reticle pod 2.

Still referring FIG. 2, in some embodiments, a number of holding structures 214, such as four holding structures, are positioned on an upper surface 211 of the base 21. The holding structures 214 are configured for supporting the reticle 5 positioned in the container 20. In some embodiments, the base 21 includes a number of through holes, such as two through holes 215. The two through holes 215 penetrate the upper surface 211 to the lower surface 212 of the base 21. The two through holes 215 may be respectively located adjacent to two corners of the base 21 and positioned adjacent one of the holding structures 214. In some embodiments, the through holes 215 are located outside of an area surrounded by the four holding structures 214. That is, when the reticle 5 is positioned in the base 21, a vertical projection of the reticle 5 is offset from the through holes 215. With the offset arrangement of the through holes 215 relative to the reticle 5, a flow of fluid passing through the through holes 215 may not be discharged toward the reticle 5 directly.

Figure 3:
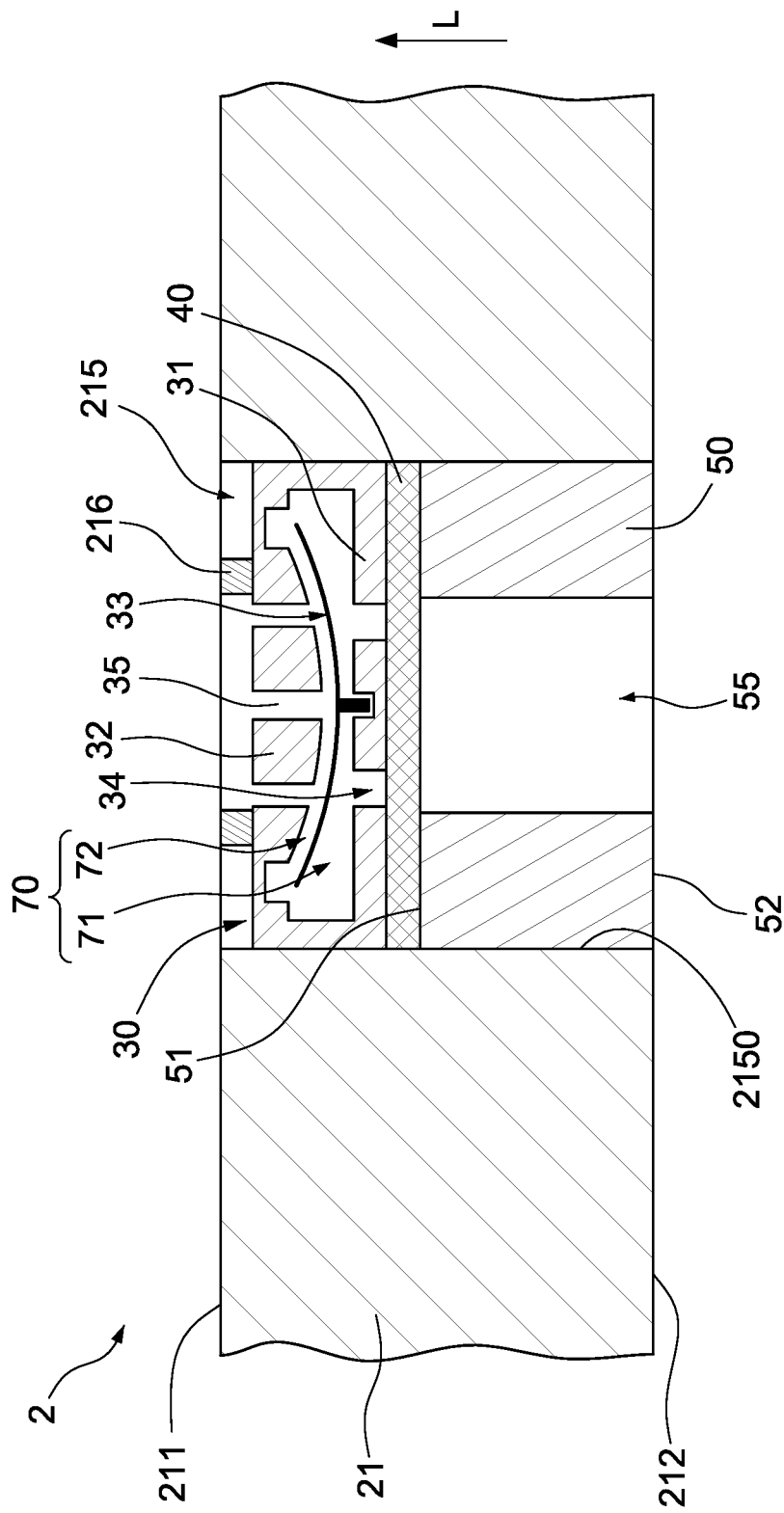
FIG. 3 is a cross-sectional view of a portion of a reticle pod taken along line A-A of FIG. 2, in accordance with some embodiments of the present disclosure.

FIG. 3 is a cross-sectional view of a portion of a reticle pod 2 taken along a line A-A of FIG. 2. In some embodiments, the through hole 215 has a constant width and has an inner wall 2150 that is perpendicular to the upper surface 211 and the lower surface 212 of the base 21. A net structure 216 is positioned at an upper end of the through hole 215 formed on the upper surface 211 of the base 21 and is configured for positioning the fluid regulating module 30 or the filter 40. The fluid regulating module 30, the filter 40 and the vent-hole cap 50 are sequentially arranged in the through hole 215 in a direction that is away from the net structure 216. The net structure 216 may be made of metal or other material and is fixed at one end of the through hole 215. The vent-hole cap 50 may be of flexible material, such as rubber or the like. The vent-hole cap 50 has a passage 55 formed at a center thereof and penetrating an upper end surface 51 and a lower end surface 52 of the vent-hole cap 50.

To assemble the reticle pod 2, according to one embodiment of the disclosure, the fluid regulating module 30 and the filter 40 are placed into the through hole 215, and then the vent-hole cap 50 is inserted into the through hole 215 via one end of the through hole 215 formed on the lower surface 212 of the base 21. When the vent-hole cap 50 is inserted into the through hole 215, the vent-hole cap 50 is tight fitted with the inner wall 2150 of the through hole 215, with its upper end surface 51 abutting against an outer edge of the filter 40 and its lower edge surface 52 being flush with the lower surface 212 of the base 21. As a result, the fluid regulating module 30 and the filter 40 are positioned in place between the net structure 216 and the vent-hole cap 50.

The fluid regulating module 30 is configured to regulate a flow of fluid in the through hole 215. The fluid regulating module 30 includes a number of caps, such as first cap 31 and second cap 32, and a sealing film 33, in accordance with some embodiments. In some embodiments, the two caps 31 and 32 are connected to each other, and the sealing film 33 is positioned between the two caps 31 and 32.

Figure 4:
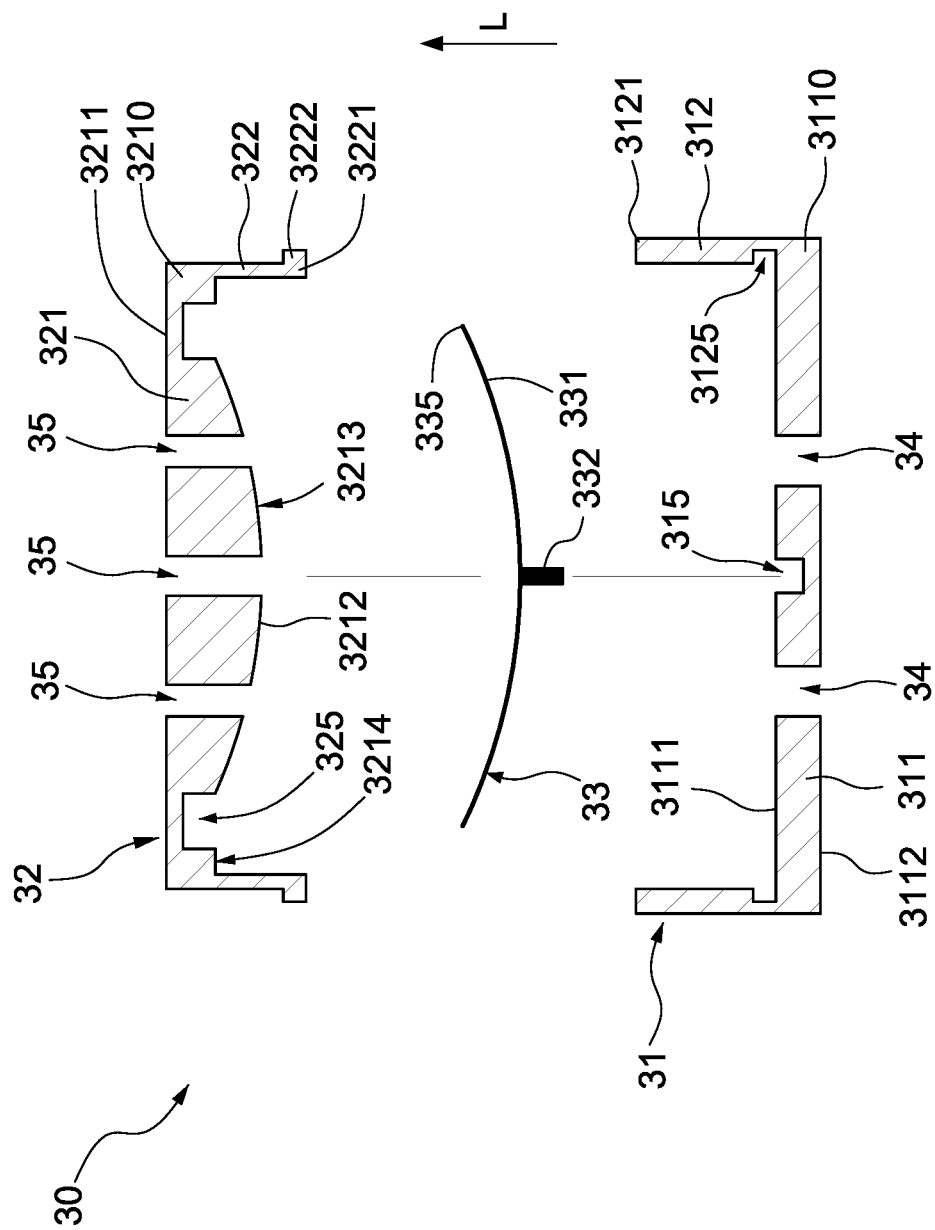
FIG. 4 is an exploded view of a fluid regulating module, in accordance with some embodiments of the present disclosure.

FIG. 4 is an exploded view of the fluid regulating module 30, in accordance with some embodiments of the present disclosure. In some embodiments, the first cap 31 includes a first base portion 311 and a first lateral portion 312. The first lateral portion 312 is connected to an edge 3110 of the first base portion 311. The first lateral portion 312 extends toward the second cap 32 in a direction parallel to a longitudinal direction L of the fluid regulating module 30 and terminates at a distal end 3121. In some embodiments, a number of openings 34 (also referred to as first openings) are formed on the first base portion 311. The first openings 34 penetrate an inner surface 3111 and an outer surface 3112 of the first base portion 311. In addition, a guiding hole 315 is formed on the inner surface 3111 of the first base portion 311 and includes a cylindrical hole extending along a direction that is parallel to the longitudinal direction L. In some embodiments, the first openings 34 are arranged around the guiding hole 315 and spaced apart with a constant distance in a circumferential direction of the first base portion 311. An engaging structure 3125 is formed on a proximal end of the first lateral portion 312 that is connected to the edge 3110 of the first base portion 311. In the present embodiment, the engaging structure 3125 includes a recess.

In some embodiments, the second cap 32 includes a second base portion 321 and a second lateral portion 322. The second lateral portion 322 is connected to an edge 3210 of the second base portion 321. The second lateral portion 322 extends toward the first cap 31 in a direction parallel to the longitudinal direction L of the fluid regulating module 30 and terminates at a distal end 3221. In some embodiments, a number of openings 35 (also referred to as second openings) are formed on the second base portion 321. The second openings 35 penetrate an inner surface 3212 and an outer surface 3211 of the second base portion 321.

In some embodiments, the inner surface 3212 of the second cap 32 faces the inner surface 3111 of the first cap 31. The inner surface 3212 includes a central region 3213 and a boundary region 3214. The boundary region 3214 surrounds the central region 3213 and connects the central region 3213 to the second lateral portion 322. The central region 3213 has a convex surface, and thus a portion of the second cap 32 relative to the central region 3213 is thicker at the center and thinner at the edge. The second openings 35 are dispersed on the central region 3213 of the inner surface 3212, and the boundary region 3214 of the inner surface 3212 is free of the second opening 35.

A groove 325 is formed on the boundary region 3214 of the inner surface 3212. The groove 325 may has a circular shape and completely surrounds the central region 3213 and located immediately adjacent to the central region 3213. In some embodiments, side walls of the grooves 325 are perpendicular to the inner surface 3212. Alternatively, side walls of the grooves forms an acute angle with the inner surface 3212.

In addition, an engaging structure 3222 is formed at the distal end 3221 of the second lateral portion 322. In the present embodiment, the engaging structure 3222 includes a protrusion. Through the engaging structure 3125 and the engaging structure 3222, the first cap 31 and the second cap 32 are detachably connected to each other. It will be noted that the configurations of the engaging structures 3125 and 3222 are not limited to the embodiment illustrated in FIG. 4 and can be modified as long as the engaging structure 3125 of the first cap 31 are compatible with the engaging structure 3222 of the second cap 32. For example, in the other embodiment, the engaging structure 3125 includes a protrusion and the engaging structure 3222 includes a recess. In some embodiments, the engaging structures 3215 and 3222 are omitted. The first cap 31 is connected to the second cap 32 by fitting the second lateral portion 322 into the first lateral portion 312. In some embodiments, the first cap 31 and the second cap 32 are integrally connected.

The sealing film 33 is configured to cover the second openings 35 of the second cap 32. The sealing film 33 includes a main body 331 and a positioning pin 332, in accordance with some embodiments. In some embodiments, the main body 331 is made of flexible material, such as silica rubber, PFA or the like. As a result, when the main body 331 is compressed to abut against the inner surface 3212, the main body 331 is deformed to have a conformal shape with the inner surface 3212 of the second cap 32. In some embodiments, the main body 331 is curved away from the second cap 32, and the main body 331 and the central region 3213 of the inner surface 3212 may have the same curvature. Therefore, the main body 331 may be attached to the inner surface 3212 of the second cap 32 more firmly. However, it will be appreciated that many variations and modifications can be made to embodiments of the disclosure. In some other embodiments, both the central region 3213 of the inner surface 3212 and the main body 331 are formed with flat shapes.

In some embodiments, a width of the main body 331 (i.e., distance between two sides of the outer edge 335 in a direction perpendicular to the longitudinal direction L of the fluid regulating module 30) is greater than a width of the central region 3213 of the inner surface 3212. As a result, when the main body 331 is in contact with the inner surface 3212 of the second cap 32, all of the second openings 35 formed on the central region 3213 are covered by the main body 331. Moreover, a portion of the main body 331 that is adjacent to the outer edge 335 is received in the groove 325. Advantage of these features will be described in detail in embodiments relative to FIG. 9.

In some embodiments, the positioning pin 332 is connected to a side of the main body 331 that faces the inner surface 3111 of the first cap 31. The positioning pin 332 is located relative to the guiding hole 315 formed on the first cap 31. To assemble, the positioning pin 332 is inserted into the guiding hole 315 to connect the sealing film 33 to the first cap 31. In some embodiments, the positioning pin 332 is movably connected to the guiding hole 315. The sealing film 33 can be moved in a direction that is parallel to the longitudinal direction L of the fluid regulating module 30 relative to the first cap 31. Nevertheless, the movement of the sealing film 33 in a direction perpendicular to the longitudinal direction L of the fluid regulating module 30 is limited by the guiding hole 315. However, it will be appreciated that many variations and modifications can be made to embodiments of the disclosure. In other embodiments, the positioning pin 332 is fixed in the guiding hole 315, and the sealing film 33 is not allowed to move in the direction that is parallel to the longitudinal direction L of the fluid regulating module 30.

Referring back to FIG. 3, in some embodiments, the fluid regulating module 30 has a flowing path 70 defined between the first cap 31 and the second cap 32. Specifically, the flowing path 70 includes a first segment 71 and a second segment 72. The first segment 71 communicates with the first openings 34 and located between the sealing film 33 and the first cap 31. The second segment 72 communicates with the first segment 71 and the second openings 35 and located between the sealing film 33 and the second cap 32. According to the flowing direction of a fluid entering the fluid regulating module 30, the second segment 72 of the flowing path 70 may be open or closed by controlling a movement of the sealing film 33 in a direction that is parallel to the longitudinal direction L of the fluid regulating module 30. Therefore, a flow of the fluid passing through the fluid regulating module 30 can be regulated.

The filter 40 is configured to remove particles or contaminations in a fluid that flows into the through hole 215. In some embodiments, the filter 40 is a pliable and thin structure (i.e., having a thickness less than 1 mm, for example.) In some embodiments, the filter 40 includes a chemical filter or a high-efficiency particulate air (HEPA) filter. In some embodiments, as shown in FIG. 3, the filter 40 is positioned adjacent to the first cap 31 and is placed in between the fluid regulating module 30 and the vent-hole cap 50. An outer edge of the filter 40 is sandwiched between the outer surface 3112 of the first cap 31 and the upper end surface 51 of the vent-hole cap 50. Since an outer edge of the filter 40 is securely compressed between the first cap 31 and the upper end surface 51, a warpage of the filter 40 can be avoided.

However, it will be appreciated that many variations and modifications can be made to embodiments of the disclosure. The filter 40 can be placed in any suitable position in the through hole as long as the fluid entering the through hole from one end is able to pass through the filter before its leaving from the other end of the through hole.

Figure 5:
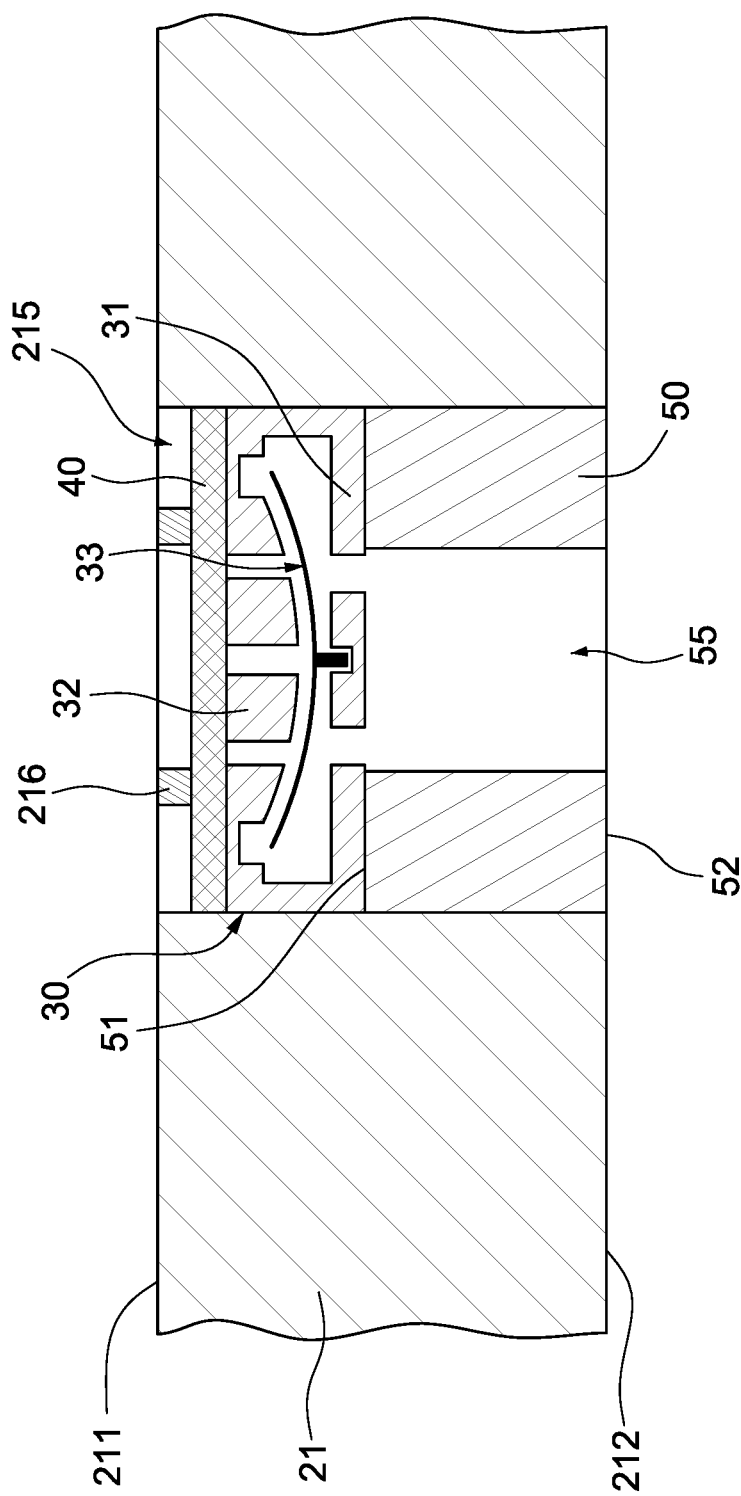
FIG. 5 is a cross-sectional view of a portion of a reticle pod, in accordance with some embodiments of the present disclosure.
Figure 6:
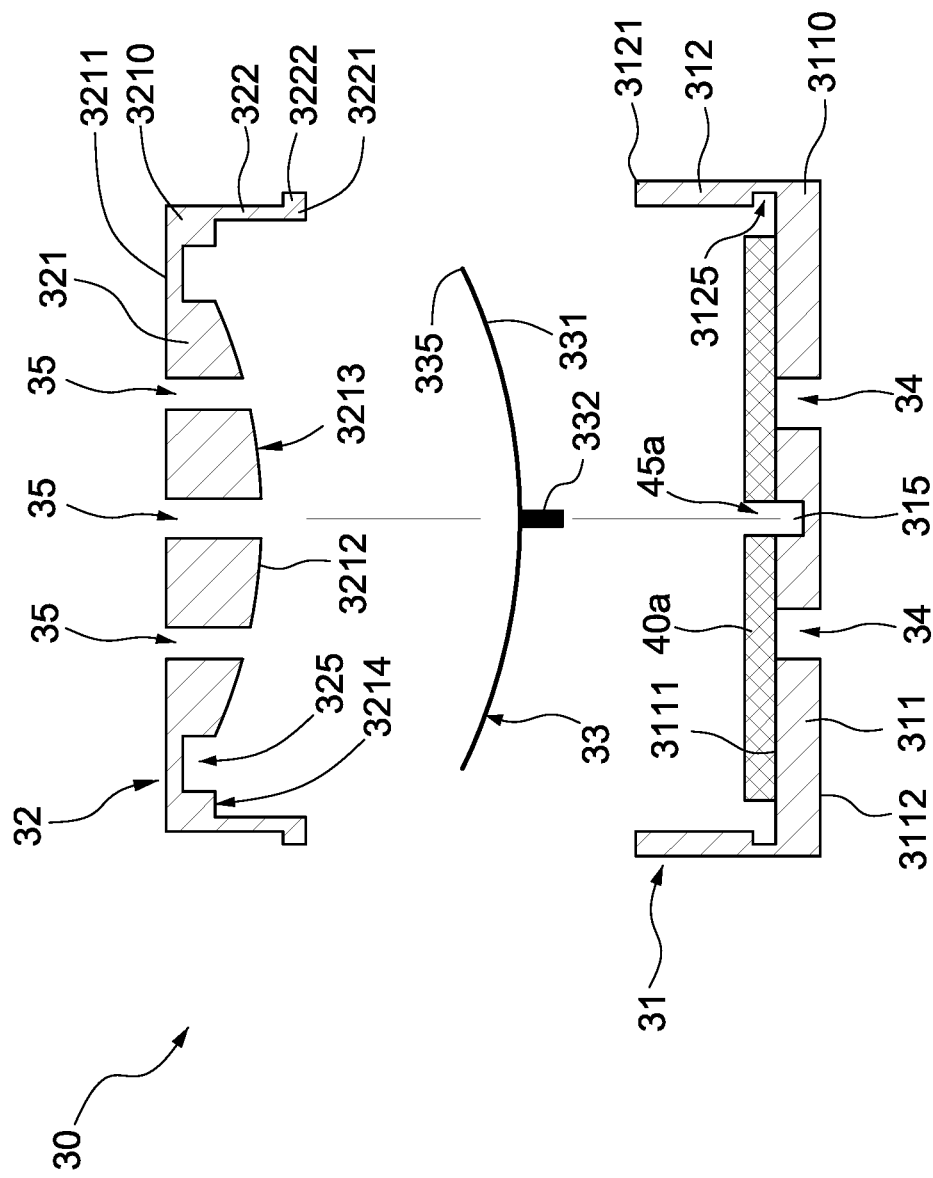
FIG. 6 is an exploded view of a fluid regulating module, in accordance with some embodiments of the present disclosure.

In one exemplary embodiment as shown in FIG. 5, the filter 40 is positioned adjacent to the second cap 32 of the fluid regulating module 30 and is placed in between the net structure 216 and the fluid regulating module 30. There is no filter 40 placed in between the fluid regulating module 30 and the vent-hole cap 50. The upper end surface 51 of the vent-hole cap 50 is directly in contact with the first cap 31 of the fluid regulating module 30. In one another exemplary embodiment as shown in FIG. 6, a filter 40a is placed inside the fluid regulating module 30 and covers the openings of the fluid regulating module 30. In some embodiments, the filter 40a is connected to the first cap 31 and covers the openings 34 of the first cap 31. In cases where the guiding hole 315 for limiting the movement of the sealing film 33 is formed on the first cap 31, a through hole 45a is formed on the filter 40a. The filter 40a may be attached on the inner surface 3111 of the first cap 31 through a suitable adhesive material with the through hole 45a being aligning with the through hole 315. Alternatively, the filter positioned in the fluid regulating module 30 covers the second opening 35 of the second cap 32.

It is noted that while there is one single filter being positioned in the through hole 215, the number of the filters in the through hole 215 is not limited to the embodiments shown in FIGS. 3, 5 and 6 of the present disclosure. In some other embodiments, there are more than two filters 40 positioned in the through hole 215. The two or more filters 40 may be consecutively arranged. Alternatively, two filters 40 are respectively positioned adjacent to the first cap 31 and the second cap 32 of the fluid regulating module 30.

Figure 7:
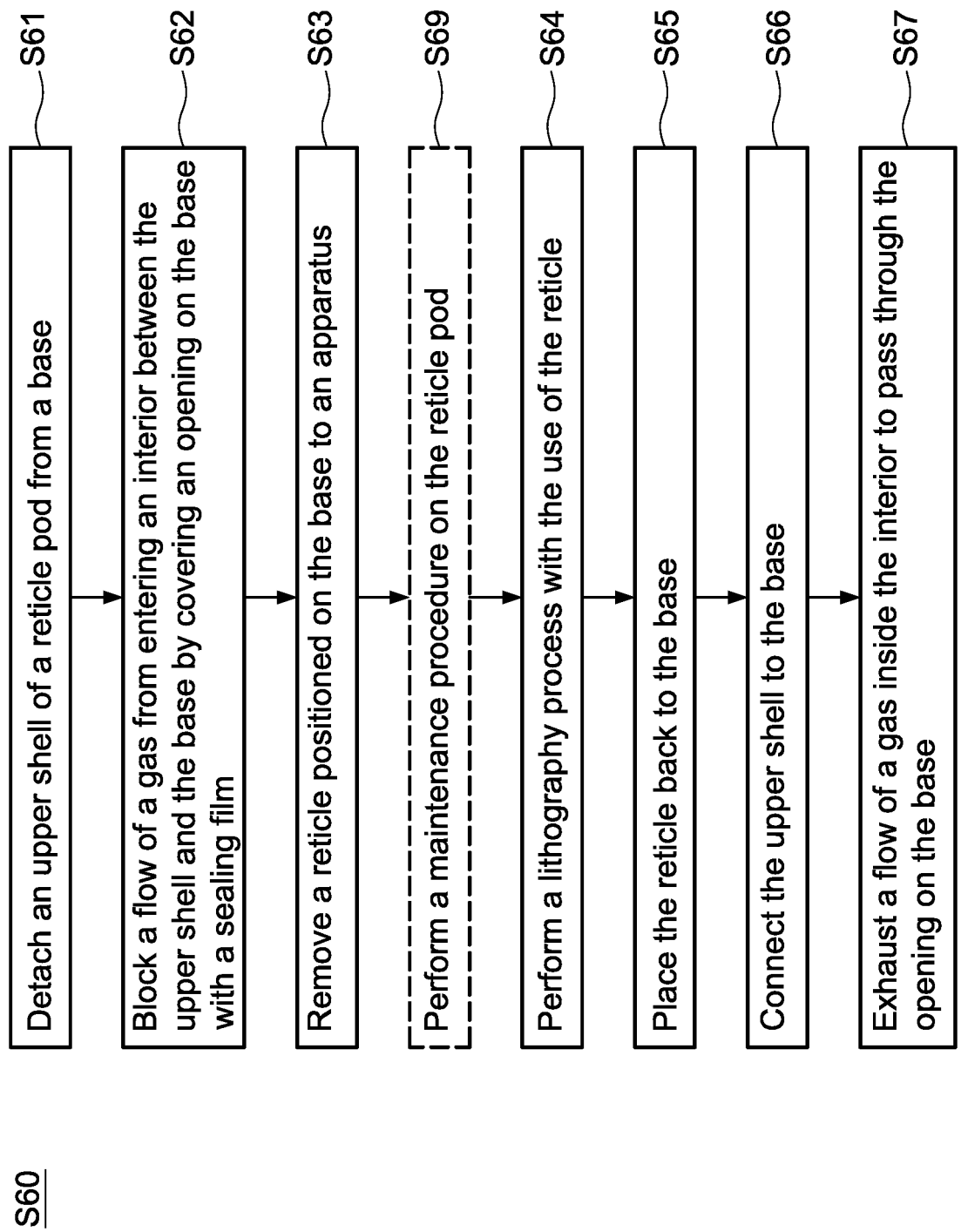
FIG. 7 is a flow chart illustrating a method for performing a lithography operation, in accordance with various aspects of one or more embodiments of the present disclosure.

FIG. 7 is a flow chart illustrating a method S60 for performing a lithography operation, in accordance with various aspects of one or more embodiments of the present disclosure. For illustration, the flow chart will be described along with the drawings shown in FIGS. 6-14. Some of the described stages can be replaced or eliminated in different embodiments.

Figure 8:
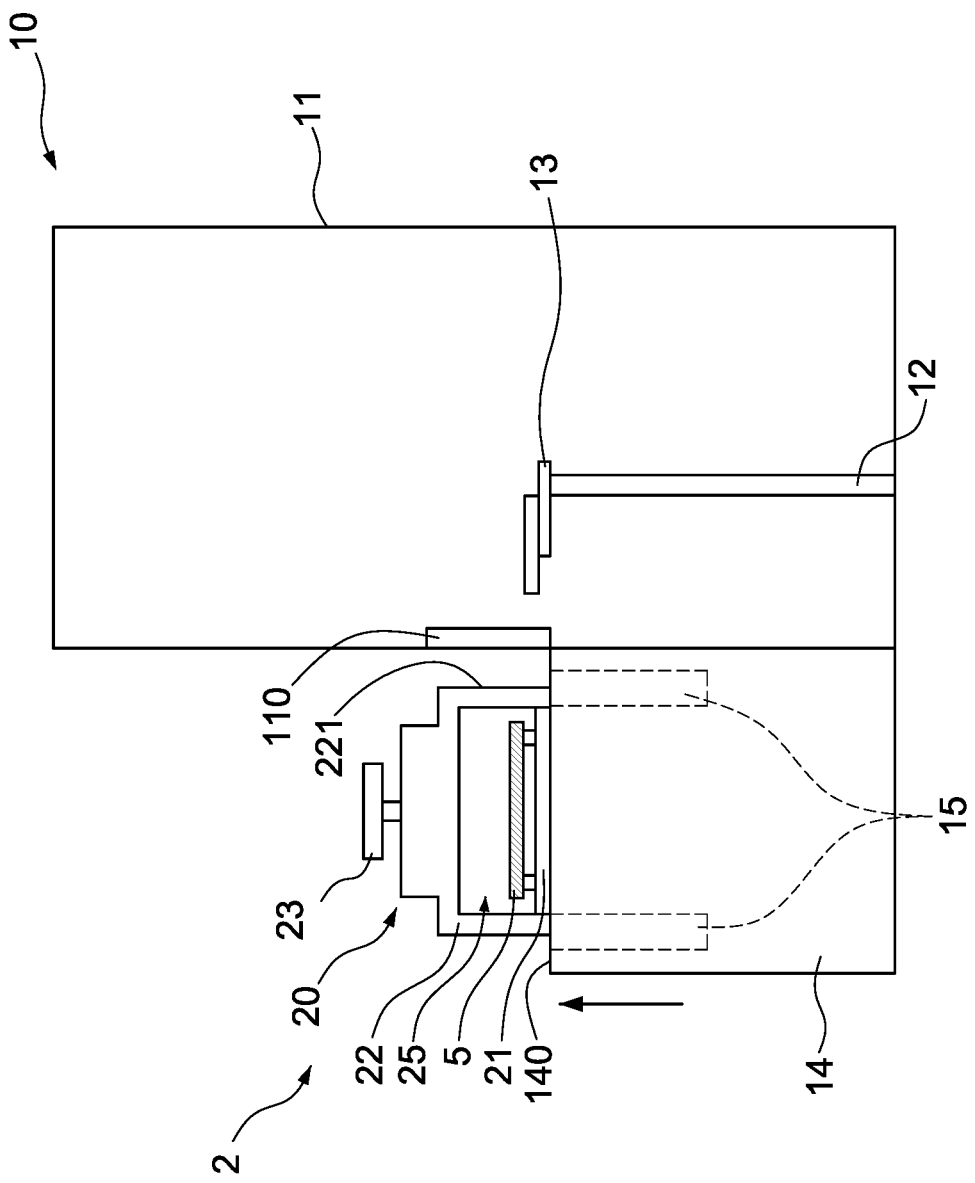
FIG. 8 is a schematic view illustrating one stage of a method for performing a lithography operation at which an upper shell of a reticle pod is detached from a base, in accordance with one or more embodiments of the present disclosure.

The method S60 includes operation S61, in which the upper shell 22 of the reticle 2 is detached from the base 21. In some embodiments, as shown in FIG. 8, the upper shell 22 is automatically removed from the base 21 by the lift pins 15. When the reticle pod 2 is placed on the load port 14, the lateral wall 221 of the upper shell is placed upon an upper end of the lift pins 15. To open the reticle pod 2, the lift pins 15 is driven to move along an upward direction indicated by the arrow in FIG. 8 to remove the upper shell 22 from the base 21. However, it will be appreciated that many variations and modifications can be made to embodiments of the disclosure. In some other embodiments, the upper shell 22 is manually removed from the base 21 by an operator.

Figure 9:
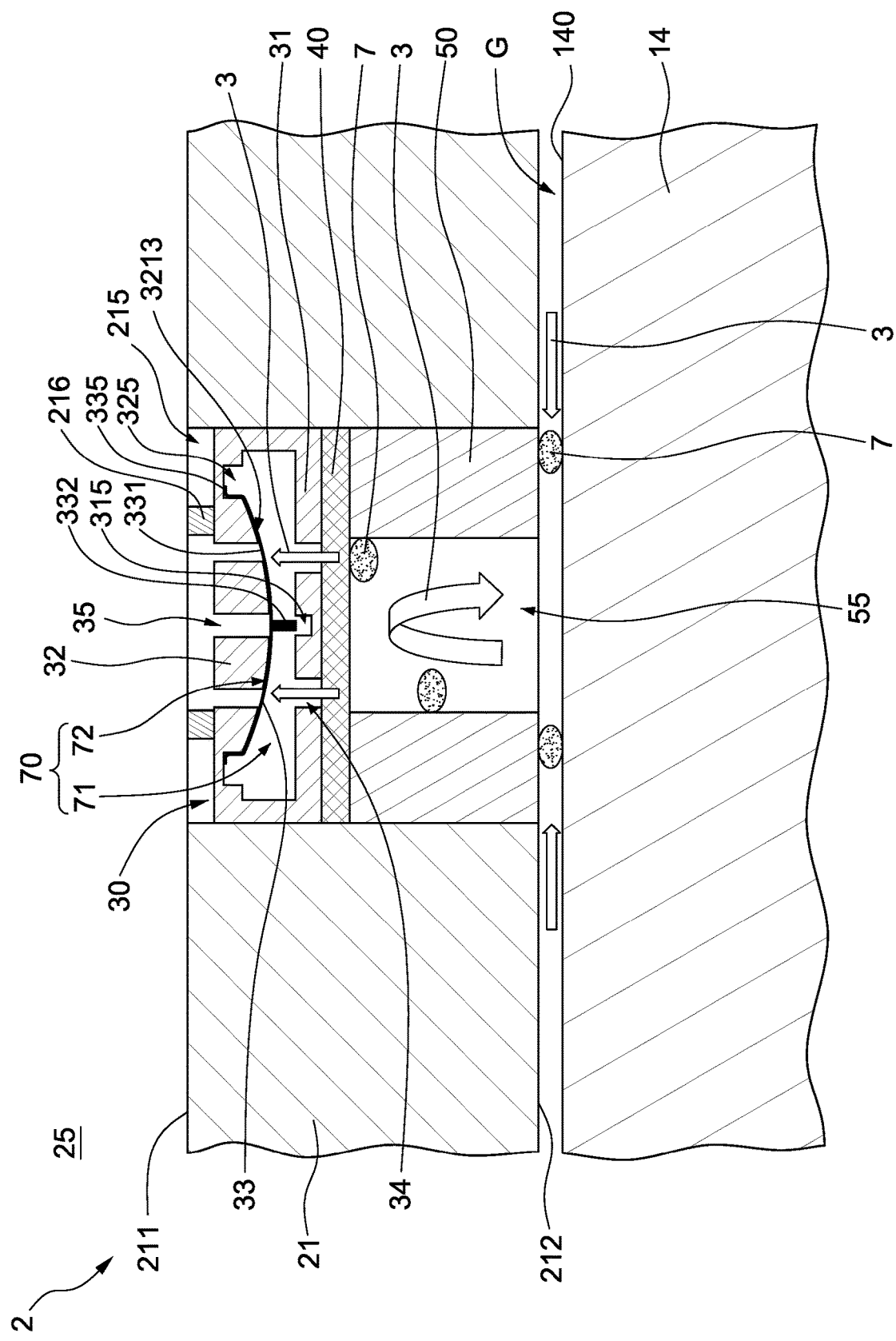
FIG. 9 is a cross-sectional view of partial elements of a reticle pod as an upward gas flow is generated and a fluid regulating module is in a sealed state, in accordance with one or more embodiments of the present disclosure.

The method S60 also includes operation S62, in which a flow of gas is blocked from entering an interior 25 between the upper shell 22 and the base 21. In some embodiments, during the upward movement of the upper shell 22 in operation S61, a pressure difference between the interior 25 of the container 20 and the ambient pressure actuates a flow of gas flowing into the interior 25 of the container 20. Specifically, as shown in FIG. 9, a flow of gas 3 is actuated to flow through a gap G between the lower surface 212 of the base 21 and an upper surface 140 of the load port 14, the passage 55 of the vent-hole cap 50, the filter 40 and the first opening 34 of the first cap 31 and then is actuated to flow into the first segment 71 of the flowing path 70 in the fluid regulating module 30. When the flow of gas 3 enters the fluid regulating module 30 along a direction toward the interior 25 of the container 20 as indicated by thick arrows in FIG. 9 through the first opening 34, the fluid regulating module 30 turns to a sealed state. In the sealed state, the sealing film 33 is thrusted by the flow of gas 3 to move upward and abut against the central region 3213 of the second cap 32. As a result, the second segment 72 of the flowing path 70 between the sealing film 33 and the second cap 32 is closed, and the second opening 35 of the second cap 32 is blocked by the main body 331 of the sealing film 33. Therefore, the flow of gas 3 is not allowed to entering the interior 25.

In some embodiments, due to the pliable property of the main body 331, the main body 331 has a conformal shape with the second cap 32 after the contact with the second cap 32, and a portion of the sealing film 33 which directly faces the central region 3213 has the identical curvature with that of the central region 3213. In addition, the outer edge 335 of the sealing film 33 is received in the groove 325 of the second cap 32 and extends along inner walls of the grooves 325. Since a portion of the main body 331 is received in the groove 325, a boundary between the second cap 32 and the sealing film 33 is tortuous (i.e., not extending along a smooth curve line or straight line), thereby improving the sealing between the second cap 32 and the sealing film 33.

In some embodiments, during the upward movement of the sealing film 33, a movement of the sealing film 33 in a horizontal direction (i.e., a direction that is perpendicular to the longitudinal direction L of the fluid regulating module 30) is limited by the guiding hole 315, and the sealing film 33 is moved freely in a vertical direction. As such, a concern that a portion of second openings 35 are not covered by the sealing film 33 due to position shift of the sealing film 33 is mitigated. However, it will be appreciated that many variations and modifications can be made to embodiments of the disclosure. In cases where the positioning pin 332 and the guiding hole 315 are omitted, all the second openings 35 can be stably covered by sealing film 33 as long as the width of the main body 331 of the sealing film 33 is sufficiently greater than a distance between two outermost second openings 35 in a direction that is perpendicular to the longitudinal direction L.

In some embodiments, contaminations or particles 7 in the gap G between the lower surface 212 of the base 21 and an upper surface 140 of the load port 14 enters the through hole 215 along with the flow of gas 3. The contaminations or particles 7 may be removed by the filter 40 and be not allowed to enter the fluid regulating module 30. However, the filter 40 may become thicker over time which degrades the ability of the filter 40 to filter out contaminants or particles 7, and the contaminants or particles 7 may enter the fluid regulating module 30 along with the flow of gas 3. In this case, the contaminants or particles 7 are blocked from entering the interior 25 by the sealing film 33, so that the reticle 5 (FIG. 1) stored in the reticle pod 2 is still protected from being contaminated.

Figure 10:
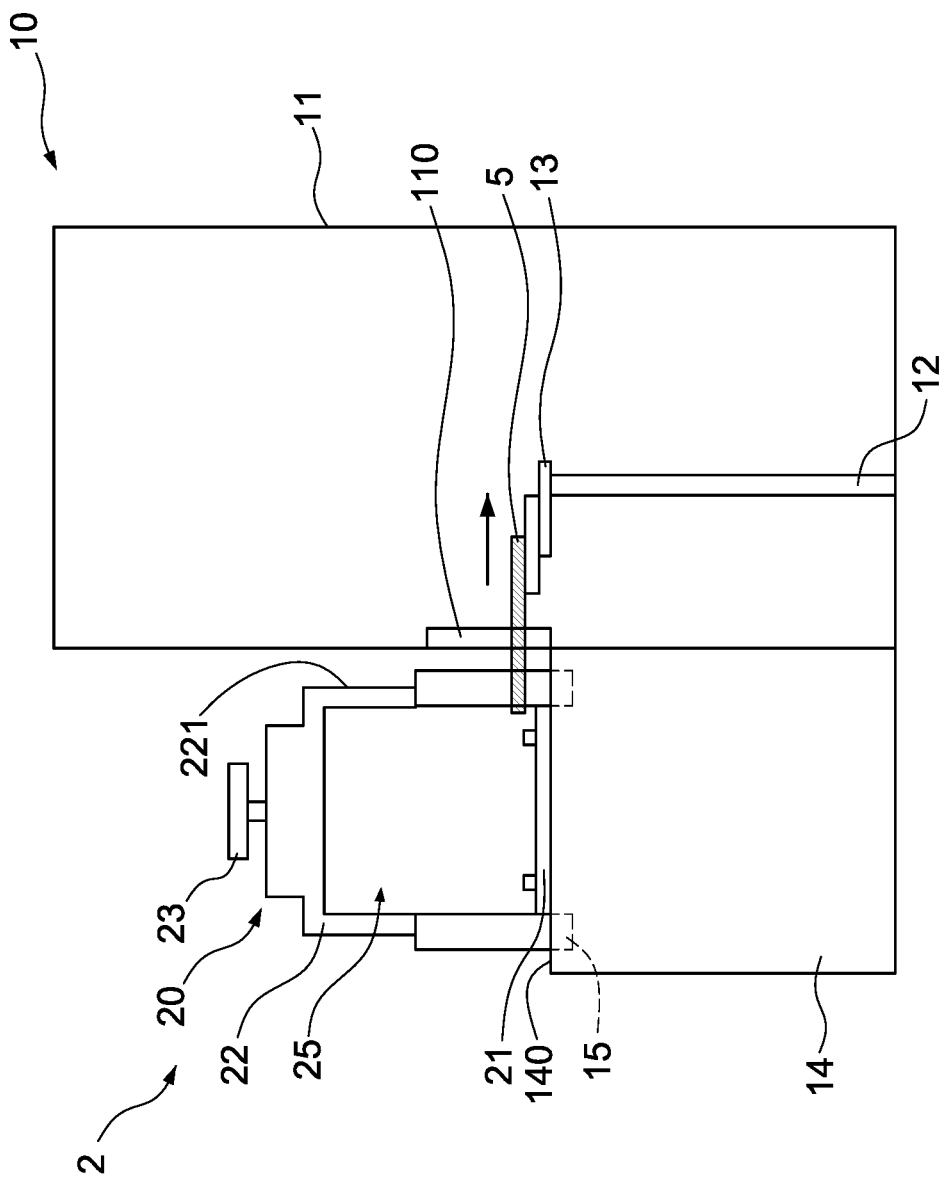
FIG. 10 is a schematic view illustrating one stage of a method for performing a lithography operation at which a reticle is removed from a reticle pod and is sent to a process chamber, in accordance with one or more embodiments of the present disclosure.

The method S60 also includes operation S63, in which the reticle 5 positioned on the base 21 is removed from the reticle pod 2. In some embodiments, as shown in FIG. 10, once the upper shell 22 is moved to a higher position, the blade 13 of the transferring mechanism 12 accesses the reticle 5 from the base 21 to the processing tool 11.

The method S60 also includes operation S64, in which a lithography operation is performed. In some embodiments, the reticle 5 in the processing tool 11 is be secured on a reticle chuck (not shown in figures) at which a light energy, such as extreme ultraviolet (EUV) light, is projected onto the reticle 5 and is reflected by the reticle 5 to expose a photoresist film deposited on a semiconductor wafer (not shown in figures). When the lithography operation is completed, the method S60 continues to operation S65, in which the reticle 5 is placed back to the base 21 of the previous reticle pod 2 or another reticle pod 2 by the blade 13 of the transferring mechanism 12.

The method S60 includes operation S66, in which the upper shell 22 is connected to the base 21. In some embodiments, the upper shell 22 is automatically connected to the base 21 by the lift pins 15. To close the reticle pod 2, the lift pins 15 is driven to move along a downward direction indicated by the arrow in FIG. 11 to connect the upper shell 22 to the base 21.

The method S60 includes operation S67, in which a flow of gas is exhausted from the interior 25 between the upper shell 22 and the base 21. In some embodiments, during the downward movement of the upper shell 22 in operation S66, a pressure difference between the interior 25 of the container 20 and the ambient pressure actuates a flow of gas flowing out of the interior 25 of the container 20. Specifically, as shown in FIG. 12, a flow of gas 4 is actuated to flow through the second opening 35, the second segment 72 of the flowing path 70, the first segment 71 of the flowing path 70, the first opening 34, the filter 40, the passage 55 of the vent-hole cap 50 in sequence and is exhausted to the gap G between the lower surface 212 of the base 21 and the upper surface 140 of the load port 14.

Figure 11:
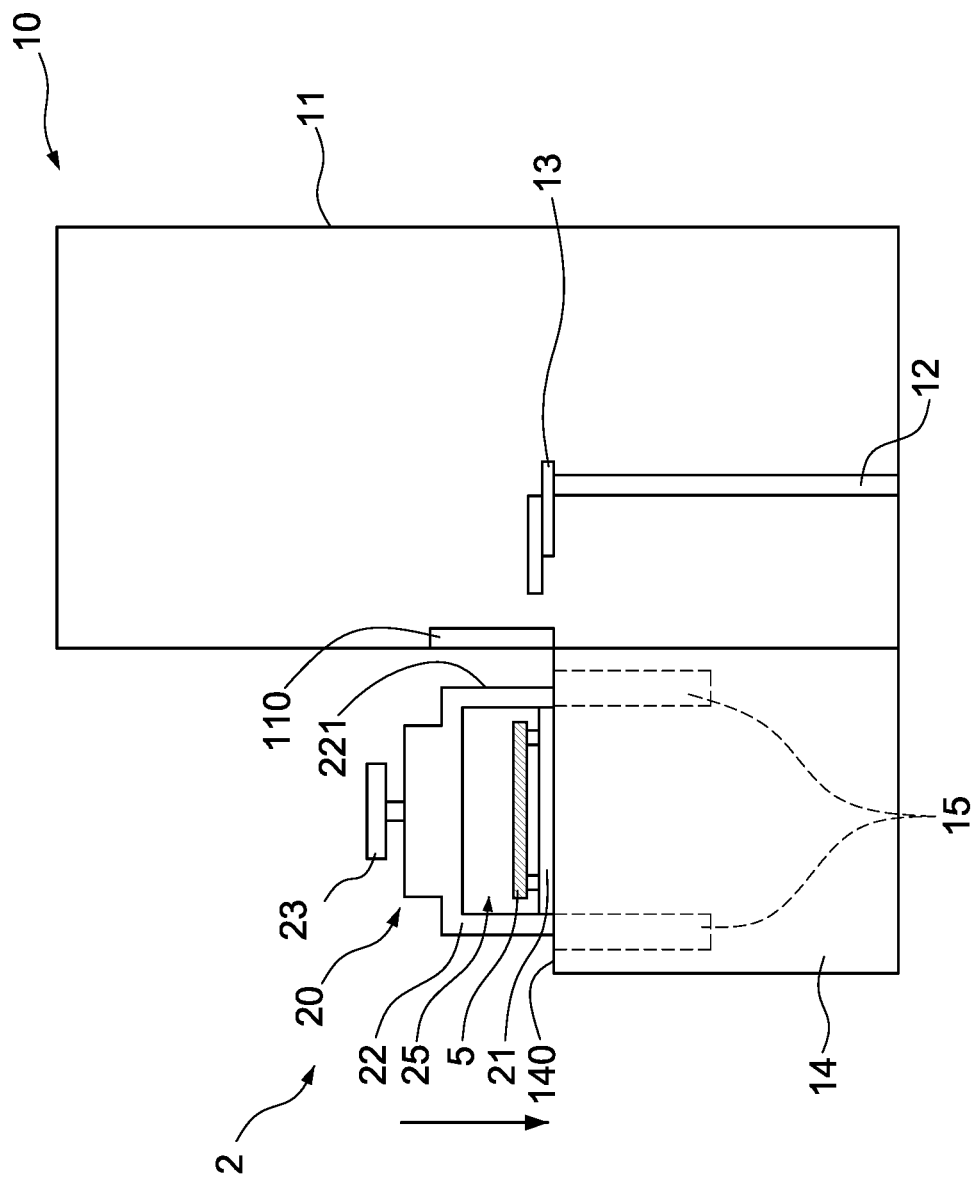
FIG. 11 is a schematic view illustrating one stage of a method for performing a lithography operation at which an upper shell of a reticle pod is lower down to engage with a base, in accordance with one or more embodiments of the present disclosure.
Figure 12:
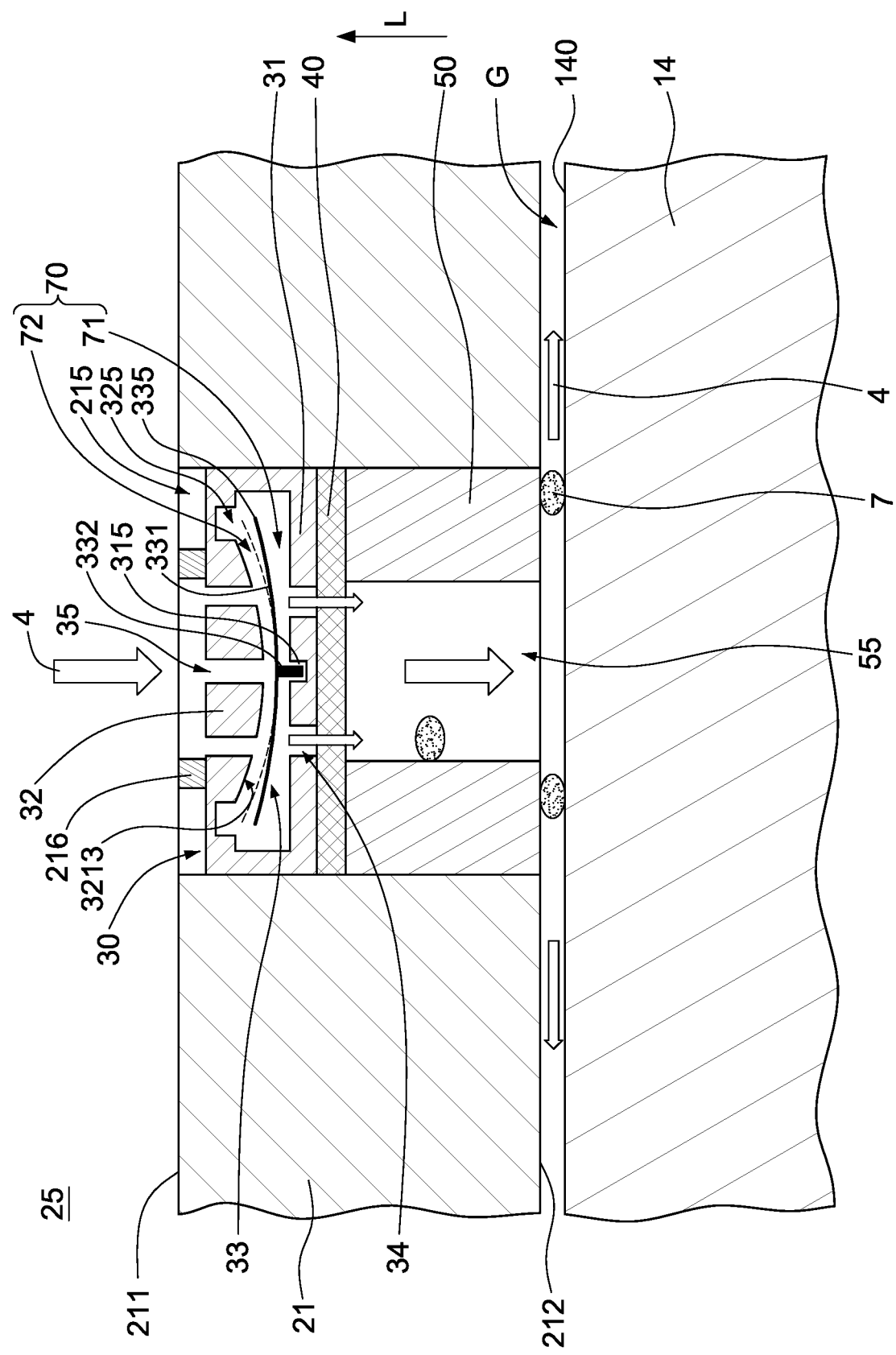
FIG. 12 is a cross-sectional view of partial elements of a reticle pod as a downward gas flow is generated and a fluid regulating module is in an open state, in accordance with one or more embodiments of the present disclosure.

As shown in FIG. 11, when the flow of gas 3 enters the fluid regulating module 30 along a direction away from the interior 25 of the container 20 as indicated by thick arrows in FIG. 12 from the second opening 35, the fluid regulating module 30 turns to an open state. In the open state, the sealing film 33 is thrusted by the flow of gas 4 to move downward. As a result, the second segment 72 of the flowing path 70 between the sealing film 33 and the second cap 32 is open, and the flow of gas 4 is allowed to pass through the second opening 35 of the second cap 32. In some embodiments, during the exhaust of the flow of gas 4, with the support of the positioning pin 332, the outer edge 335 of the main body 331 is bent away from the second cap 32, the deformation of the main body 331 gradually increases from its center to the outer edge 335. For example, as shown in FIG. 12, the outer edge 335 of the main body 331 is farther away from the inner surface 3212 than a central portion of the main body 331 (i.e., a portion that is connected to the positioning pin 332). In addition, during the exhaust of the flow of gas 4, the outer edge 335 of the main body 331 is moved out of the groove 325 of the second cap 32.

Figure 13:
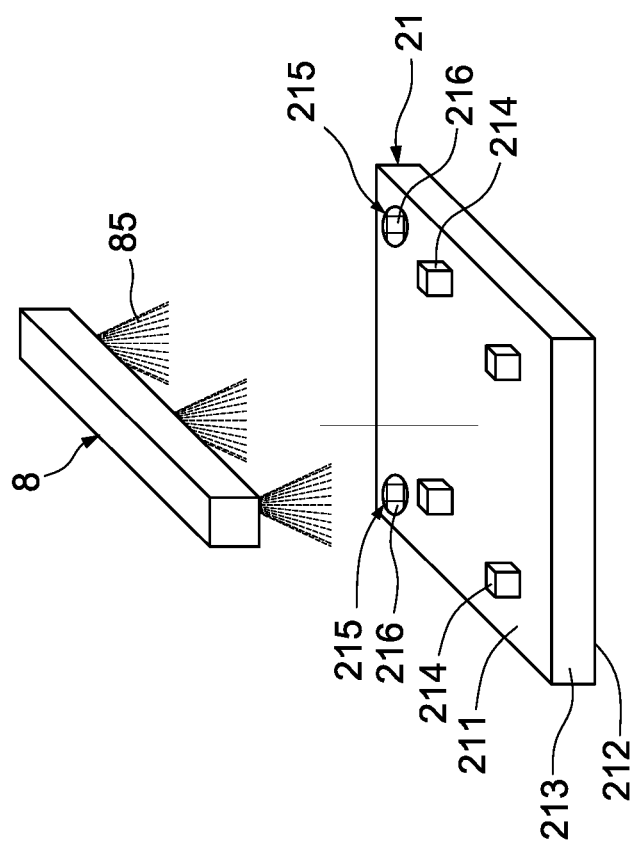
FIG. 13 is a schematic view illustrating one stage of a method for performing a maintenance process to a reticle pod, in accordance with one or more embodiments of the present disclosure.

In some embodiments, the method S60 further includes operation S69, in which a maintenance procedure is performed on the reticle pod 2. Operation S69 is performed after the removal of the reticle 5 from the reticle pod 2. In the maintenance procedure, the base 21 and the upper shell 22 of the reticle pod 2 may be cleaned separately. For example, as shown in FIG. 13, the base 21 of the reticle pod 2 is moved below a cleaning tool 8, and a cleaning liquid 85 is discharged from the cleaning tool 8 over the upper surface 211 of the base 21 to clean the base 21. The cleaning liquid 85 may include water, such as DI water, or another chemical liquid which can clean effectively. In some embodiments, the cleaning liquid includes $(NH_4)_2SO_4$, $H_2O$, DMSO (dimethyl sulfoxide), MEA (methyl ethyl amide), BDG (diethylene glycol monobutyl ether)), NEA (n,n-dimethylacetamide), or NMP (n-methyl pyrrolidone).

Figure 14:
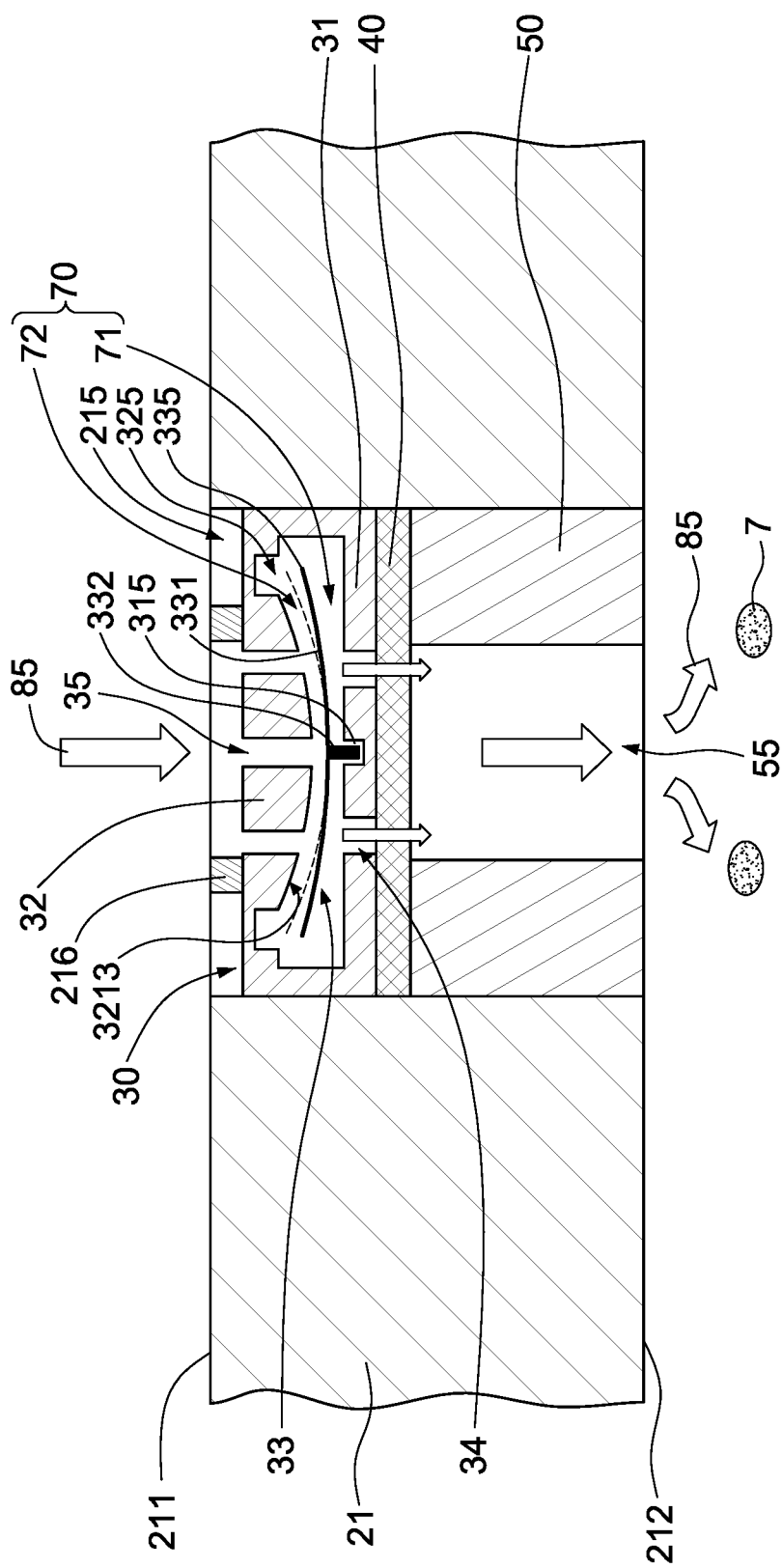
FIG. 14 is a cross-sectional view of partial elements of a reticle pod as a downward liquid flow passes through a through hole of the reticle pod and a fluid regulating module is in an open state, in accordance with one or more embodiments of the present disclosure.

In some embodiments, as shown in FIG. 14, a portion of the cleaning liquid 85 is removed from the upper surface 211 of the base 21 through the thought hole 215. When the cleaning liquid 85 enters the thought hole 215, the cleaning liquid 85 passes through the second opening 35, the second segment 72 of the flowing path 70, the first segment 71 of the flowing path 70, the first opening 34, the filter 40, and the passage 55 of the vent-hole cap 50 in sequence. The cleaning liquid 85 removes the particles 7 from the through hole 215, so that the filter 40 and the vent-hole cap 50 are cleaned.

In some embodiments, operation S69 is performed after operation S63. After the reticle 5 is removed from the base 21, the upper shell 22 is connected to the base 21 and the container 20 is removed from the load port 14 to the cleaning tool 8 for the maintenance procedure. After the maintenance procedure, the container 20 is sent back to the load port 14 for receiving the previous or another reticle 5. In some embodiments, the cleaning tool 8 is positioned in the process tool 11, and the base 21 is moved into the process tool 11 and is cleaned in the process tool 11.

It is noted that, as shown in FIG. 14, since the outer edge of the filter 40 is securely fitted between the fluid regulating module 30 and the vent-hole cap 50, damage to the outer edge of the filter 40 due to the flushing of the cleaning liquid during the maintenance procedure can be prevented. Therefore, lifespan of the filter 40 is prolonged and manufacturing cost is accordingly reduced.

It is noted that while the fluid regulating module 30 is mounted to a container for carrying a reticle used in lithography operation, the embodiments of present disclosure is noted limited thereto. In some other embodiments, the fluid regulating module 30 is positioned in a through hole of another carrier used in semiconductor fabrication. The carriers may include a standard mechanical interface (SMIF) pods which can hold a plurality of semiconductor wafers (e.g. 200 mm or 8 inch), or front opening unified pods (FOUPs) which can hold larger semiconductor wafers (e.g. 300 mm (12 inch) or 450 mm (18 inch)).

Embodiments of method and device for preventing reticle contamination are provided. The fluid regulating module positioned in a through hole of the reticle pod allows an outlet flow of gas exhausting from the interior of the reticle pod but blocks an inlet flow of gas from entering the interior of the reticle. Therefore, conditions that degrade the result of photolithography operation due to an abnormality of the reticle can be prevented, and the production yield of the semiconductor wafers which are being patterned by the reticle is greatly improved.

According to some embodiments of present disclosure, a method is provided. The method includes detaching an upper shell of a reticle pod from a base. The method further includes while the upper shell is detached from the base, blocking an inlet flow of gas from entering an interior of the reticle pod between the upper shell and the base with a use of a fluid regulating module which is in a sealed state. In the sealed state of the fluid regulating module, an opening of the fluid regulating module is covered with a sealing film. The method also includes removing a reticle positioned on the base to a process tool. In addition, the method includes performing a lithography operation in the process tool with the use of the reticle.

According to some embodiments of present disclosure, a method for regulating a flow of gas in a carrier used in semiconductor fabrication is provided. The method includes positioning a fluid regulating module on the carrier. The fluid regulating module comprises a first cap, a second cap connected to the first cap and located closer to an interior of the carrier than the first cap, and a sealing film located between the first and second caps. The method further includes blocking a flow of gas from flowing from the first cap to the second cap by covering a plurality of openings formed on the second cap by the sealing film. The method further includes guiding a flow of gas from the interior of the carrier to consecutively flow through the second cap to the first cap by moving the sealing film distant away from the openings of the second cap.

According to some embodiments of present disclosure, a method of controlling a fluid regulating module is provided. The fluid regulating module is positioned on a carrier and comprises a first cap, a second cap connected to the first cap and located closer to an interior of the carrier than the first cap, and a sealing film located between the first and second caps. The method includes creating a first pressure inside the interior of the carrier by detaching an upper shell of the carrier from a base of the carrier so as to keep an opening formed on the second cap covered by the sealing film and block flow from entering the interior of the carrier. The method further includes creating a second pressure inside the interior of the carrier by moving the upper shell toward the base, so as to move the sealing film distant away from the opening formed on the second cap and allow an exhaust of a flow from the interior of the carrier.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   detaching an upper shell of a reticle pod from a base;
   while the upper shell is detached from the base, blocking an inlet flow of gas from entering an interior of the reticle pod between the upper shell and the base with a use of a fluid regulating module which is in a sealed state, wherein in the sealed state of the fluid regulating module, an opening of the fluid regulating module is covered with a sealing film;
   removing a reticle positioned on the base to a process tool; and
   performing a lithography operation in the process tool with the use of the reticle.

2. The method as claimed in claim 1, wherein in the sealed state of the fluid regulating module, the sealing film has a conformal shape with an inner surface of the fluid regulating module at which the opening is formed.

3. The method as claimed in claim 1, further comprising:
   connecting the upper shell to the base; and
   while the upper shell is connected to the base, exhausting an outlet flow of gas from the interior of the reticle pod through the fluid regulating module which is in an open state, wherein in the open state of the fluid regulating module, the opening is exposed by the sealing film.

4. The method as claimed in claim 3, wherein when the upper shell is connected to the base, a pressure difference between the interior of the container and an ambient pressure actuates a flow of gas flowing out of the interior of the container so as to keep the fluid regulating module in the open state.

5. The method as claimed in claim 3, wherein in the open state of the fluid regulating module, the sealing film is deformed to bend away from the opening with a compression pressure applied by the outlet flow of gas.

6. The method as claimed in claim 3, wherein when the fluid regulating module is actuated form the sealed state to the open state, the sealing film is moved in a direction that is parallel to a longitudinal direction of the fluid regulating module.

7. The method as claimed in claim 3, wherein when the fluid regulating module is actuated form the sealed state to the open state, a movement of the sealing film in a direction perpendicular to the longitudinal direction of the fluid regulating module is limited.

8. The method as claimed in claim 1, further comprising:
performing a maintenance on the reticle pod by supplying a cleaning liquid over the base; and
guiding a flow of the cleaning liquid from an upper surface of the base to a lower surface of the base through the fluid regulating module which is in an open state, wherein in the open state of the fluid regulating module, the opening is exposed by the sealing film.

9. The method as claimed in claim 1, wherein when the upper shell of the reticle pod is detached from a base, a pressure difference between the interior of the container and an ambient pressure actuates a flow of gas flowing into the interior of the container so as to keep the fluid regulating module in the sealed state.

10. The method as claimed in claim 1, wherein the fluid regulating module is in the sealed state, an outer edge of the sealing film is received in a groove that surrounds the opening.

11. A method for regulating a flow of gas in a carrier used in semiconductor fabrication, comprising:
positioning a fluid regulating module on the carrier, wherein the fluid regulating module comprises a first cap, a second cap connected to the first cap and located closer to an interior of the carrier than the first cap, and a sealing film located between the first and second caps;
blocking a flow of gas from flowing from the first cap to the second cap by covering a plurality of openings formed on the second cap by the sealing film; and
guiding a flow of gas from the interior of the carrier to consecutively flow through the second cap to the first cap by moving the sealing film distant away from the openings of the second cap.

12. The method of claim 11, further comprising guiding the flow of gas from the interior of the carrier to pass through a filter that is positioned adjacent to the first cap or the second cap.

13. The method of claim 11, further comprising guiding the flow of gas from the interior of the carrier to pass through a passage formed in a vent-hole cap, wherein the vent-hole cap is made of rubber and the position of the first cap and the position of the second cap are limited by the vent-hole cap.

14. The method of claim 11, wherein the flow of gas from the interior of the carrier passes through a first one of the openings that is located at a center of the second cap and passes through a second one of the openings that is located at adjacent to the edge of the second cap, wherein a length of the first one of the openings is greater than a length of the second one of the openings.

15. The method of claim 11, wherein the flow of gas from the interior is guided to pass through the fluid regulating module that is positioned offset from a reticle that is received in the container.

16. The method of claim 11, wherein the flow of gas from the interior is guided to pass through the fluid regulating module that is located outside of an area surrounded by four holding structures configured for holding a reticle received in the container.

17. The method of claim 11, wherein the container is a reticle pod or a front opening unified pod (FOUP).

18. The method of claim 11, wherein when the openings of the second cap is covered by the sealing film, the sealing film has a conformal shape with an inner surface of the second cap at which the openings are formed.

19. A method for controlling a fluid regulating module, positioned on a carrier and comprising a first cap, a second cap connected to the first cap and located closer to an interior of the carrier than the first cap, and a sealing film located between the first and second caps, the method comprises:
creating a first pressure inside the interior of the carrier by detaching an upper shell of the carrier from a base of the carrier so as to keep an opening formed on the second cap covered by the sealing film and block flow from entering the interior of the carrier; and
creating a second pressure inside the interior of the carrier by moving the upper shell toward the base, so as to move the sealing film distant away from the opening formed on the second cap and allow an exhaust of a flow from the interior of the carrier.

20. The method of claim 19, wherein when the interior of the carrier is in the first pressure, a first pressure difference between the interior of the container and an ambient pressure actuates a flow of gas flowing into the interior of the container; and
when the interior of the carrier is in the second pressure, a second pressure difference between the interior of the container and the ambient pressure actuates a flow of gas flowing out of the interior of the container.

* * * * *